(12) United States Patent
Chen et al.

(10) Patent No.: US 12,544,847 B2
(45) Date of Patent: Feb. 10, 2026

(54) SOLDER PASTE DISPENSING FEEDBACK SYSTEM AND CIRCUIT BOARD PRINTER USING THE SAME

(71) Applicant: Illinois Tool Works Inc., Glenview, IL (US)

(72) Inventors: Yuexin Chen, Glenview, IL (US); Zhixue Liu, Glenview, IL (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 18/839,927

(22) PCT Filed: Mar. 13, 2023

(86) PCT No.: PCT/US2023/015088
§ 371 (c)(1),
(2) Date: Aug. 20, 2024

(87) PCT Pub. No.: WO2023/177612
PCT Pub. Date: Sep. 21, 2023

(65) Prior Publication Data
US 2025/0162052 A1    May 22, 2025

(30) Foreign Application Priority Data
Mar. 17, 2022    (CN) .......................... 202210264756.1

(51) Int. Cl.
*B23K 3/00*    (2006.01)
*B23K 3/06*    (2006.01)
(Continued)

(52) U.S. Cl.
CPC ......... *B23K 3/0638* (2013.01); *H05K 3/3485* (2020.08); *B23K 2101/42* (2018.08)

(58) Field of Classification Search
CPC .... B23K 3/0638; B23K 2101/42; B23K 3/08; B23K 35/025; H05K 3/3485;
(Continued)

(56) References Cited

U.S. PATENT DOCUMENTS

2003/0097941 A1* 5/2003 Rossmeisl ............ B23K 3/0692
101/129
2009/0321394 A1  12/2009 Matsushita
(Continued)

FOREIGN PATENT DOCUMENTS

CN         207669967 U     7/2018
CN         108886889 A  * 11/2018  ......... H05K 13/0409
(Continued)

OTHER PUBLICATIONS

International Search Report for PCT Application No. PCT/US2023/015088 mailed Jul. 10, 2023.

*Primary Examiner* — Kiley S Stoner
(74) *Attorney, Agent, or Firm* — Lando & Anastasi, LLP (57)    ABSTRACT

The present application provides a solder paste dispensing feedback system (10) for a circuit board printer. The system (10) comprises a solder paste container (101), a solder paste extruding device, a first sensor, a second sensor and a control device. The solder paste container (101) is used to contain solder paste and has an outlet. The solder paste extruding device is used to extrude the solder paste from the outlet of the solder paste container (101). The first sensor is used to detect solder paste in the solder paste container (101), and generate a first signal to indicate whether the solder paste container (101) still contains solder paste. The second sensor is used to detect an operating state of the solder paste container (101), and generate a second signal to indicate whether solder paste is extruded from the outlet of the solder paste container (101). The control device is used to receive the first signal and the second signal, and control the
(Continued)

operation of the circuit board printer according to the indications of the first signal and the second signal.

6 Claims, 5 Drawing Sheets

(51) Int. Cl.
    *H05K 3/3485*     (2026.01)
    *B23K 101/42*     (2006.01)

(58) Field of Classification Search
    CPC .............. H05K 3/1233; B41P 2233/30; B41F 15/0881; B41F 31/022; B41F 31/28; B41F 15/405; B41F 33/02
    USPC ..... 228/102–103, 8–12, 33, 41, 248.1–248.5
    See application file for complete search history.

(56) References Cited

U.S. PATENT DOCUMENTS

| | | | | |
|---|---|---|---|---|
| 2014/0366754 | A1* | 12/2014 | Kobayashi | B41F 15/42 101/114 |
| 2015/0258774 | A1* | 9/2015 | Uchida | B41F 15/42 101/129 |
| 2019/0091785 | A1* | 3/2019 | Fukakusa | H05K 3/1233 |
| 2022/0080721 | A1* | 3/2022 | D'Annunzio | B41F 31/02 |
| 2023/0271411 | A1* | 8/2023 | Chassot | B41F 9/063 101/153 |
| 2025/0162052 | A1* | 5/2025 | Chen | B41F 15/405 |

FOREIGN PATENT DOCUMENTS

| | | | | |
|---|---|---|---|---|
| CN | 112026357 A | * | 12/2020 | ............ B41F 31/02 |
| CN | 114801461 A | * | 7/2022 | ........... B01D 33/801 |
| DE | 102018120865 A1 | * | 2/2020 | ............. B41F 15/42 |
| JP | S5737916 U | | 2/1982 | |
| JP | H0839763 A | * | 2/1996 | |
| JP | 3755906 B2 | * | 3/2006 | |
| JP | 6283736 B2 | | 2/2018 | |
| KR | 1866838 B1 | * | 7/2018 | |
| KR | 101866838 B1 | * | 7/2018 | ........... H05K 3/1233 |
| KR | 20200093630 A | * | 8/2020 | .......... B41F 15/0881 |
| WO | WO-0010810 A1 | * | 3/2000 | ............. B41F 31/02 |
| WO | WO-2019216516 A1 | * | 11/2019 | ............... H05K 3/34 |

* cited by examiner

SOLDER PASTE DISPENSING FEEDBACK SYSTEM AND CIRCUIT BOARD PRINTER USING THE SAME

CROSS REFERENCE TO RELATED APPLICATIONS

This application is a U.S. National Phase Application under 35 U.S.C. § 371 of International Application No. PCT/US2023/015088, filed Mar. 13, 2023, which claims priority to Chinese Priority application No. 202210264756.1 filed on Mar. 17, 2022, the entire contents of each of which is hereby incorporated by reference.

TECHNICAL FIELD

The present invention relates to a solder paste dispensing feedback system for a circuit board printer, and a circuit board printer using the solder paste dispensing feedback system.

BACKGROUND ART

During the manufacture of a surface-mount printed circuit board, a circuit board printer may be used to print solder paste onto the circuit board, to enable electronic components to be subsequently deposited on the circuit board. A circuit board with an electrically conductive surface is conveyed into the circuit board printer, and correctly aligned with openings in a stencil of the circuit board printer, from below, by means of one or more small holes or marks (called "fudicials") on the circuit board. A solder paste dispensing device of the circuit board printer descends from above the stencil to a height closer to the stencil, and extrudes solder paste onto the stencil from a solder paste cartridge. After the solder paste has been dispensed onto the stencil, a squeegee of the circuit board printer moves against an upper surface of the stencil, to force the solder paste through the openings in the stencil and onto the electrically conductive surface of the circuit board. Solder paste is typically dispensed onto the stencil from standard solder paste cartridges. The solder paste cartridge contains a limited volume of solder paste, and after all of the solder paste in the solder paste cartridge has been dispensed, the cartridge needs to be replaced with a new solder paste cartridge for dispensing.

SUMMARY OF THE INVENTION

The present application provides a solder paste dispensing feedback system, which makes it possible to judge whether the solder paste in a solder paste cartridge has been used up, thus helping to improve the operating efficiency of a circuit board printer and guarantee printing quality.

The solder paste dispensing feedback system provided in the present application uses two sensors, and a control device judges whether the solder paste in the solder paste cartridge has been used up according to the results detected by both sensors. Thus, the judgment of the controller regarding whether the solder paste in the solder paste cartridge has been used up is more accurate, and the operation of the circuit board printer is controlled on this basis.

According to one aspect of the present application, the present application provides a solder paste dispensing feedback system for a circuit board printer. The system comprises a solder paste container, a solder paste extruding device, a first sensor, a second sensor and a control device. The solder paste container is used to contain solder paste and has an outlet. The solder paste extruding device is used to extrude the solder paste from the outlet of the solder paste container. The first sensor is configured to detect solder paste in the solder paste container and generate a first signal, the first signal being used to indicate whether the solder paste container still contains solder paste. The second sensor is configured to detect an operating state of the solder paste container and generate a second signal, the second signal being used to indicate whether solder paste is extruded from the outlet of the solder paste container. The control device is configured to receive the first signal and the second signal, and control the operation of the circuit board printer according to the indications of the first signal and the second signal.

In the solder paste dispensing feedback system as described above, the control device is configured such that: when the first signal of the first sensor indicates that there is solder paste in the solder paste container, and the second signal of the second sensor indicates that solder paste is extruded from the outlet of the solder paste container, the control device controls the circuit board printer to continue operating; when the first signal of the first sensor indicates that there is solder paste in the solder paste container, and the second signal of the second sensor indicates that no solder paste is extruded from the outlet of the solder paste container within a predetermined period of time, the control device controls the circuit board printer to issue a confirmation prompt, so as to prompt an operator to confirm by observation whether the solder paste in the solder paste container has been used up; when the first signal of the first sensor indicates that there is no solder paste in the solder paste container, and the second signal of the second sensor indicates that solder paste is extruded from the outlet of the solder paste container, the control device controls the circuit board printer to continue operating; or when the first signal of the first sensor indicates that there is no solder paste in the solder paste container, and the second signal of the second sensor indicates that no solder paste is extruded from the outlet of the solder paste container within a predetermined period of time, the control device controls the circuit board printer to issue a replacement prompt, to prompt the operator to replace the solder paste container.

In the solder paste dispensing feedback system as described above, the solder paste dispensing feedback system comprises a mounting support for fixing the solder paste container. The solder paste container has a tail portion close to the outlet. The first sensor is arranged on the mounting support close to the tail portion of the solder paste container.

In the solder paste dispensing feedback system as described above, the solder paste has an extrusion path from the outlet of the solder paste container, and the second sensor is located downstream of the outlet of the solder paste container in the direction of the extrusion path of the solder paste, and close to the outlet of the solder paste container.

In the solder paste dispensing feedback system as described above, the first sensor is an eddy current proximity switch.

In the solder paste dispensing feedback system as described above, the second sensor is a high-frequency photoelectric sensor.

In the solder paste dispensing feedback system as described above, the high-frequency photoelectric sensor defines an opening region, and the extrusion path of the solder paste passes through the opening region.

In the solder paste dispensing feedback system as described above, the photoelectric sensor is a slot-type photoelectric sensor or a frame-type photoelectric sensor.

In the solder paste dispensing feedback system as described above, the solder paste extruding device is a gas input device. The solder paste container has a gas inlet and a piston, the gas inlet being arranged at one end of the solder paste container opposite the outlet, and the piston being contained in the solder paste container. The solder paste container receives gas through the gas inlet from the gas input device, and the piston is configured to be pushed in the direction of the outlet of the solder paste container by the gas inputted through the gas inlet, to extrude the solder paste from the solder paste container.

According to another aspect of the present application, the present application provides a circuit board printer comprising the solder paste dispensing feedback system according to the present application.

DETAILED DESCRIPTION OF THE INVENTION

Various particular embodiments of the present application are described below with reference to the accompanying drawings, which form part of this Description. It should be understood that, where possible, identical or similar reference labels used in the present application refer to identical components.

Figure 1:
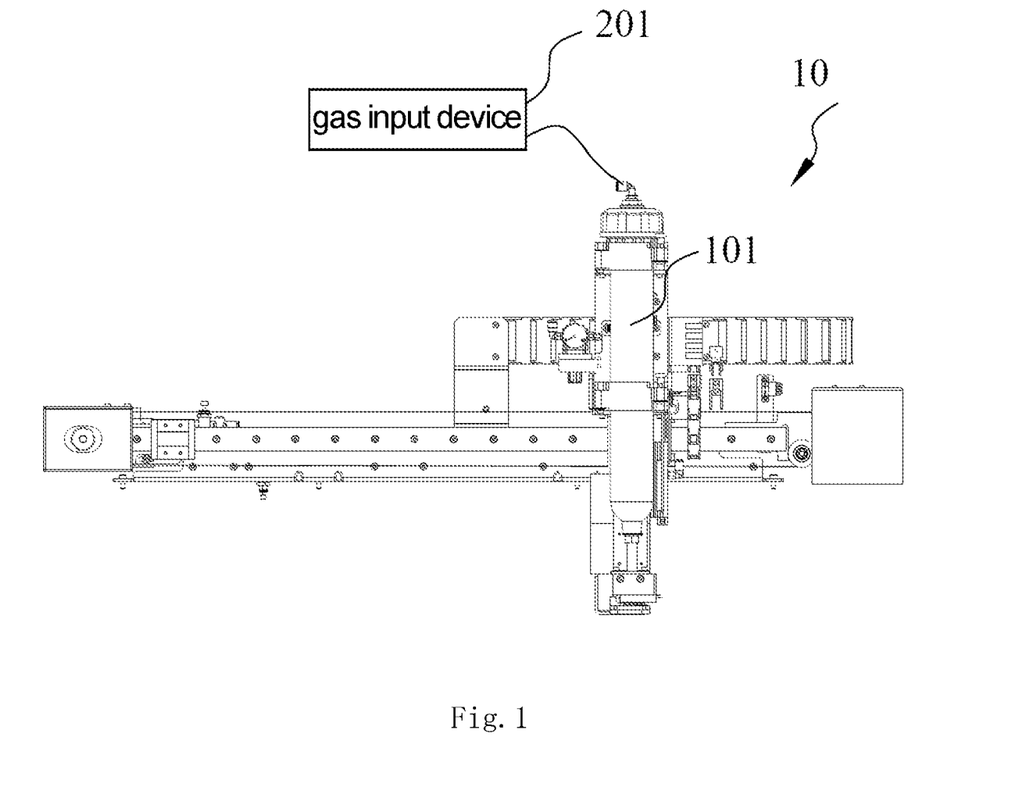
FIG. 1 is a 3D view from one angle of one embodiment of a solder paste dispensing feedback system according to the present application.

FIG. 1 shows a 3D view from one angle of one embodiment of a solder paste dispensing feedback system 10 according to the present application. As shown in FIG. 1, the solder paste dispensing feedback system 10 comprises a solder paste cartridge 101 and a gas input device 201. The gas input device 201 is connected to the solder paste cartridge 101, to input gas into the solder paste cartridge 101.

Figure 2:
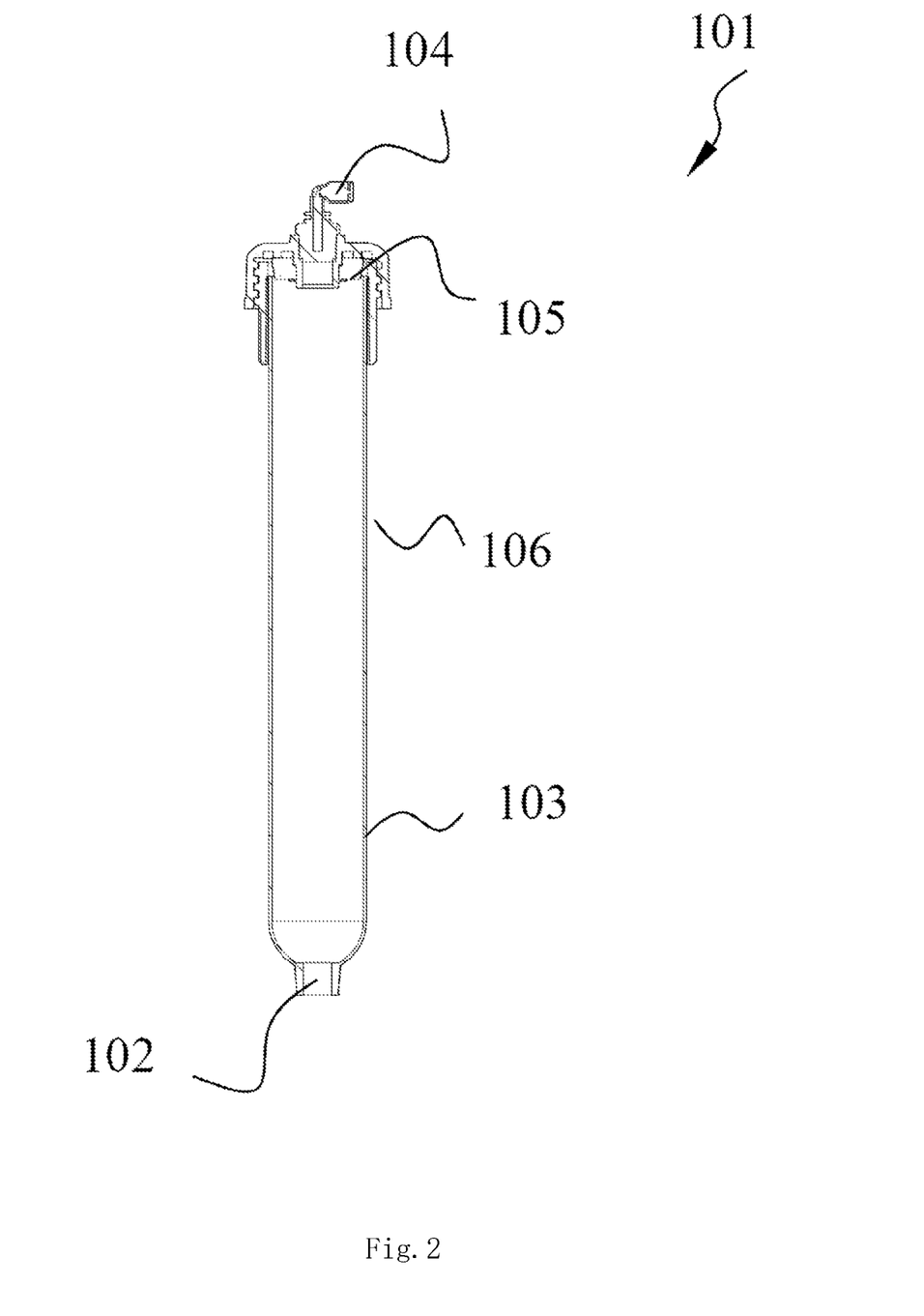
FIG. 2 is a longitudinal sectional view of the solder paste cartridge in the solder paste dispensing feedback system of FIG. 1.

FIG. 2 shows a longitudinal sectional view of the solder paste cartridge 101 used in the solder paste dispensing feedback system 10 shown in FIG. 1. The solder paste cartridge 101 is made of a plastic material. As shown in FIG. 2, the solder paste cartridge 101 comprises a gas inlet 104. The gas inlet 104 is connected to the gas input device 201, to receive gas from the gas input device 201. FIG. 2 shows that the solder paste cartridge 101 further comprises an outlet 102 disposed opposite the gas inlet 104, a tail portion 103 close to the outlet 102, and a piston 105 accommodated in the solder paste cartridge 101, the piston 105 being made of plastic. The gas input from the gas inlet 104 can push the piston 105 to move toward the outlet 102, to extrude the solder paste from the solder paste cartridge 101 onto a stencil (not shown) of a circuit board printer. As shown in FIG. 2, two ends of the piston 105 abut a cylinder wall 106 of the solder paste cartridge 101; thus, if the solder paste has good fluidity, the piston 105 can extrude all of the solder paste from the solder paste cartridge 101, without any residue forming on the cylinder wall 103 of the solder paste cartridge 101.

Figure 3:
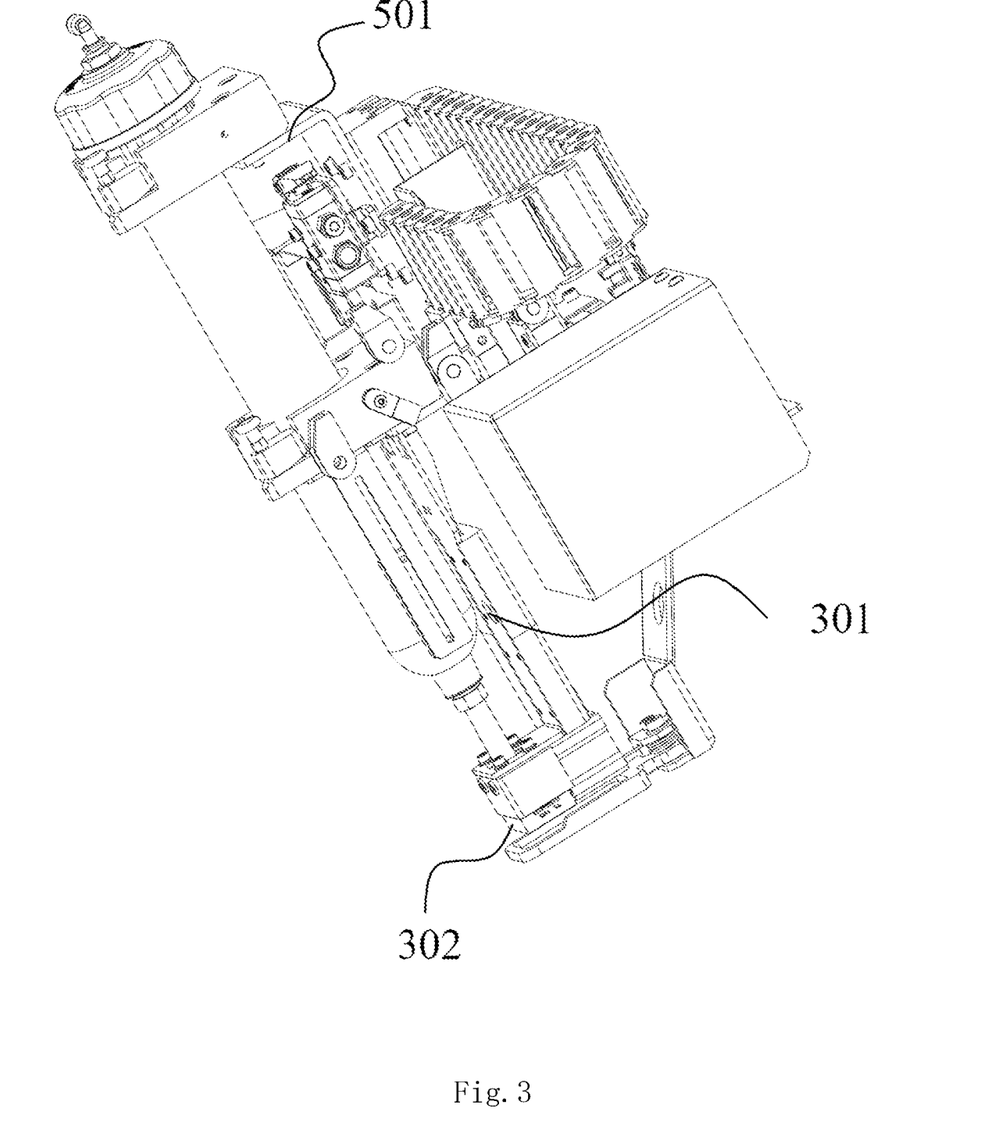
FIG. 3 is a 3D view from another angle of the solder paste dispensing feedback system shown in FIG. 1.
Figure 4A:
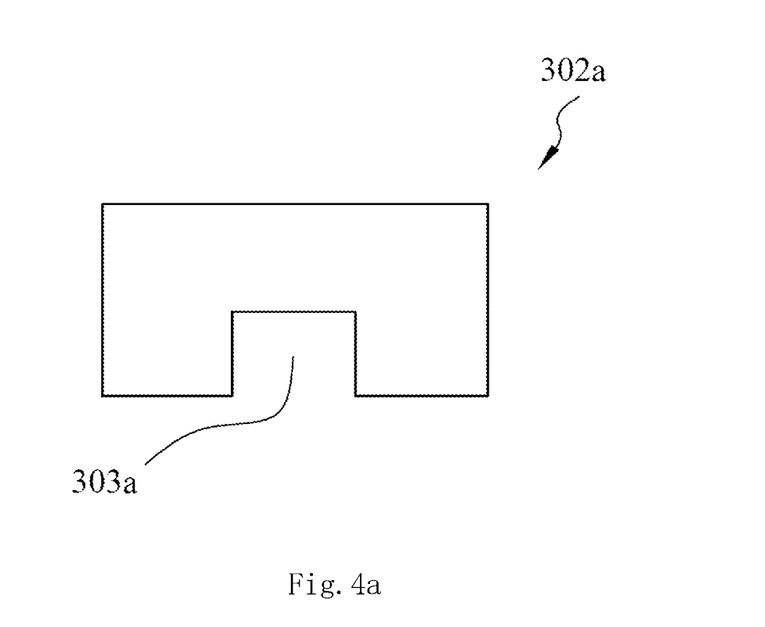
FIGS. 4a and 4b show a slot-type photoelectric sensor and a frame-type photoelectric sensor, respectively.
Figure 4B:
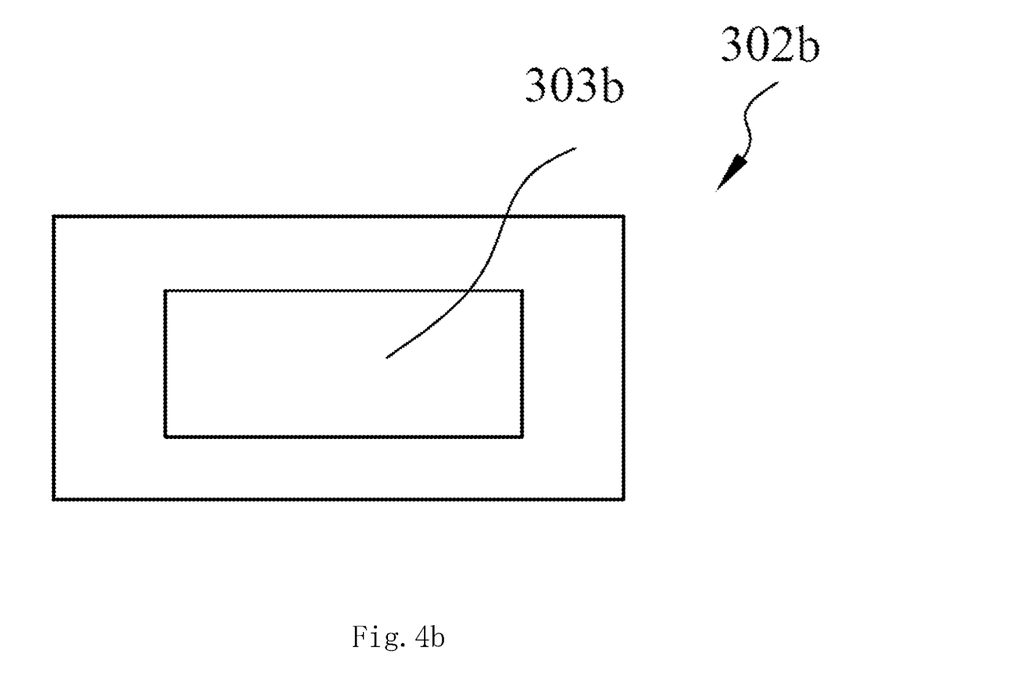

FIG. 3 shows a 3D view from another angle of the solder paste dispensing feedback system 10 shown in FIG. 1. As shown in FIG. 3, the solder paste dispensing feedback system 10 further comprises a mounting support 501, the solder paste cartridge 101 being fixed to the mounting support 501. FIG. 3 also shows that the solder paste dispensing feedback system 10 comprises sensors 301 and 302. The sensor 301 is disposed on the mounting support 501, close to the tail portion 103 of the solder paste container 101. The sensor 301 is configured to be able to detect whether metal is present nearby, and can thus detect whether the tail portion 103 of the solder paste cartridge 101 contains solder paste, and send a first signal to indicate the detection result. In one embodiment, the sensor 301 is an eddy current proximity switch. The sensor 302 is located downstream of the outlet 102 in the direction of a solder paste extrusion path from the outlet 102 of the solder paste cartridge 101 to the stencil (not shown), and is close to the outlet 102. The sensor 302 is configured to be able to detect whether there is solder paste being extruded from the outlet 102 of the solder paste cartridge 101, and send a second signal to indicate the detection result. In one embodiment, the sensor 302 is a high-frequency photoelectric sensor that defines an opening region through which the solder paste extrusion path passes. As shown in FIG. 4a or 4b, in one embodiment, the high-frequency photoelectric sensor 302 is a slot-type sensor 302a or a frame-type sensor 302b, and the solder paste extrusion path passes through an opening 303a or 303b of the slot-type sensor 302a or the frame-type sensor 302b.

Figure 5:
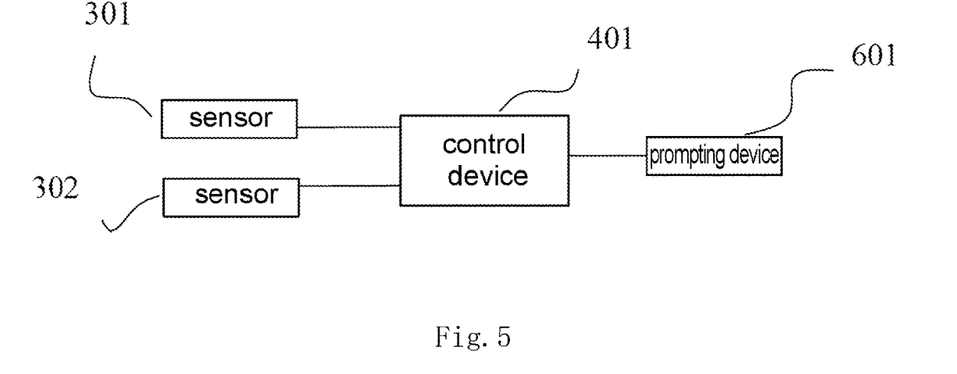
FIG. 5 is a block diagram of function modules of a solder paste dispensing feedback system according to the present application.

FIG. 5 is a block diagram of function modules of a solder paste dispensing feedback system according to the present application. As shown in FIG. 5, the solder paste dispensing feedback system 10 further comprises a control device 401 and a prompting device 601. The control device 401 communicates with the sensors 301, 302 and the prompting device 601, to receive the first signal and the second signal sent by the sensors 301 and 302 respectively, and judge whether the solder paste cartridge 101 contains solder paste by integrating the statuses indicated by the first signal and second signal, and then send an indication signal to the prompting device 601 or control the operation of the circuit board printer. Specifically, when the first signal of the sensor 301 indicates that there is solder paste in the solder paste cartridge 101, and the second signal of the sensor 302 indicates that there is solder paste being extruded from the outlet 102 of the solder paste cartridge 101, the control device 401 judges that the solder paste cartridge 101 contains solder paste, and controls the circuit board printer to continue operating. Alternatively, when the first signal of the sensor 301 indicates that there is solder paste in the solder paste cartridge 101, and the second signal of the sensor 302 indicates that there is no solder paste extruded from the outlet 102 of the solder paste cartridge 101 within a predetermined period of time, the control device 401 sends a control signal to the prompting device 601 to control the prompting device 601 to issue a confirmation prompt, so as to prompt an operator to confirm by observation whether the solder paste in the solder paste cartridge 101 has been used up. Alternatively, when the first signal of the sensor 301 indicates that there is no solder paste in the solder paste cartridge 101, and the second signal of the sensor 302 indicates that there is solder paste being extruded from the outlet 102 of the solder paste cartridge 101, the control device 401 judges that the solder paste cartridge 101 contains solder paste, and controls the circuit board printer to continue operating. Alternatively, when the first signal of the sensor 301 indicates that there is no solder paste in the solder paste cartridge 101, and the second signal of the sensor 302 indicates that there is no solder paste extruded from the outlet 102 of the solder paste cartridge 101 within a predetermined period of time, the control device 401 judges that the solder paste in the solder paste cartridge 101 has been used up, and sends a control signal to the prompting device 601 to control the prompting device 601 to issue a replacement prompt, so as to prompt the operator to replace the solder paste cartridge 101. The predetermined period of time for which the second signal indicates that no solder paste is extruded from the outlet 102 of the solder paste cartridge 101 can be reasonably set as required. In one embodiment, the predetermined period of time may be set to 10 seconds. In one embodiment, the prompting device 601 is a display of the circuit board printer; the display issues a visual alert according to the control signal received from the control device 401, to prompt observation to confirm whether the solder paste in the solder paste cartridge 101 has been used up or to prompt replacement of the solder paste cartridge 101. In other embodiments, the prompting device 601 may also be an audible alarm.

The simultaneous use of sensors 301 and 302 in the solder paste dispensing feedback system of the present application is particularly advantageous. The inventors of the present application have found that if the fluidity of the solder paste in the solder paste cartridge 101 deteriorates, when the piston 105 slides against the cylinder wall 103 of the solder paste cartridge 101 toward the outlet 102, it may not be possible to scrape off all of the solder paste sticking to the cylinder wall 103, resulting in a residue of solder paste on the cylinder wall 103. In this case, the sensor 301 can detect the solder paste remaining on the cylinder wall 103, such that the first signal sent to the control device 401 indicates that the solder paste cartridge 101 still contains solder paste. Thus, even if the solder paste in the solder paste cartridge 101 has been used up, the sensor 301 will send out a signal indicating that there is still solder paste in the solder paste cartridge 101. Therefore, if only the sensor 301 is provided, a situation will arise where the operator of the circuit board printer fails to replace the solder paste cartridge in time, which will affect the printing quality. The inventors of the present application have also found that the piston 105 might only be able to be pushed to extrude solder paste from the outlet 102 of the solder paste cartridge 101 when gas has been inputted to the gas inlet 104 of the solder paste cartridge 101 from the gas input device 201 for a certain period of time, with the result that solder paste cannot be extruded from the outlet 102 of the solder paste cartridge 101 within a predetermined period of time. Alternatively, if the fluidity of the solder paste in the solder paste cartridge 101 deteriorates, the movement speed of the piston 105 when pushed by the gas decreases, with the result that the speed at which solder paste is extruded from the outlet 102 of the solder paste cartridge 101 decreases, and solder paste cannot be extruded from the outlet 102 of the solder paste cartridge 101 within a predetermined period of time. In the case where the signal sent by the sensor 302 indicates that no solder paste is extruded within a predetermined period of time, even if there is actually still solder paste in the solder paste cartridge 101, the control device 401 will erroneously judge that there is no solder paste in the solder paste cartridge 101 based on the signal sent by the sensor 302, and thus erroneously send a control signal to the prompting device 601 to prompt replacement of the solder paste cartridge, which affects the operating efficiency of the circuit board printer. In the present application, as a result of using sensors 301 and 302 at the same time, with the control device 401 being configured to comprehensively take into account the states indicated by the signals sent by these two sensors, erroneous judgments of whether the solder paste cartridge contains solder paste are reduced or avoided, thus ensuring printing quality and improving the operating efficiency of the circuit board printer.

Figure 6:
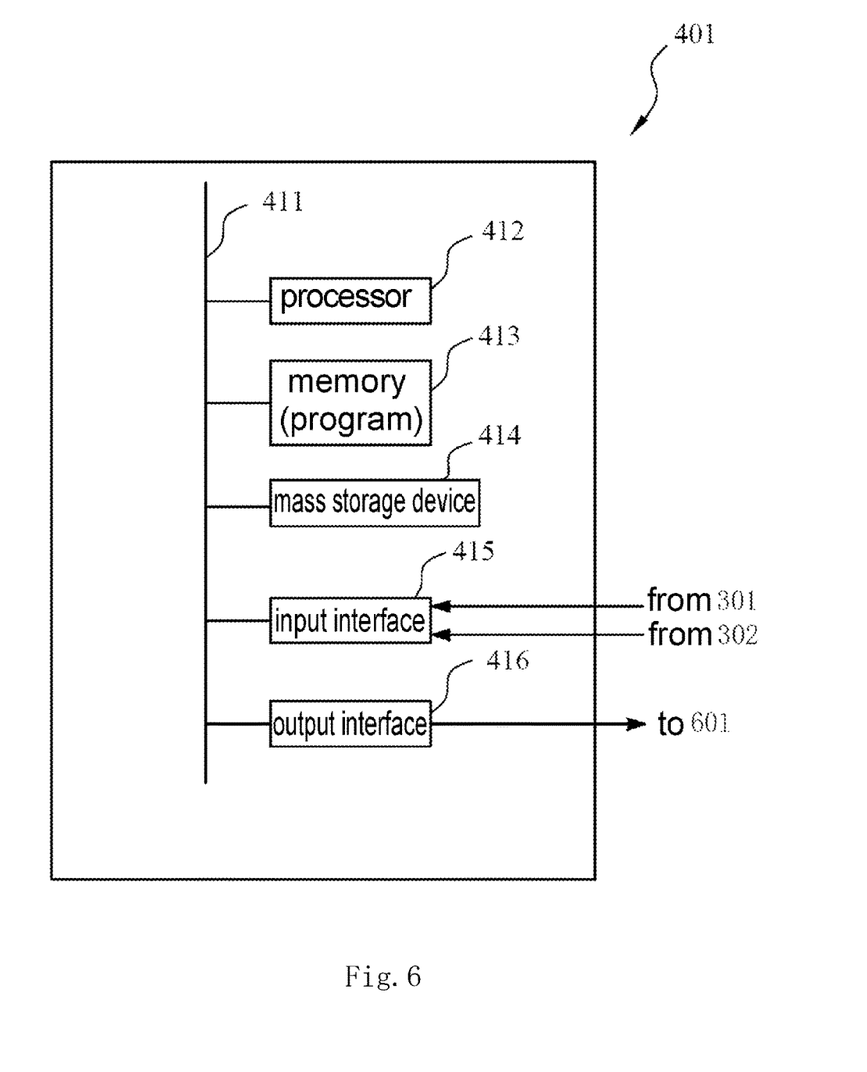
FIG. 6 is a block diagram of the control device in FIG. 5.

FIG. 6 is a schematic block diagram of the control device 401 in FIG. 5. As shown in FIG. 6, the control device comprises a bus 411. A processor 412, a memory 413, a mass storage device 414, an input interface 415 and an output interface 416 are connected to the bus 411. The processor 412 can read a program (or instruction) from the memory 413 or the mass storage device 414, and execute the program (or instruction) to perform a control function; the processor 412 can also write data or instructions into the memory 413 or the mass storage device 414. The memory 413 and the mass storage device 414 can store programs (instructions) or data. Generally, the memory 413 has a faster access speed than that of the mass storage device 414, and the mass storage device 414 has a larger memory size than that of the memory 413. By executing instructions in the memory 413, the processor 412 can control the memory 413, the mass storage device 414, the input interface 415 and the output interface 416.

The input interface 415 receives input from the sensors 301, 302, and converts the input received from the sensors 301, 302 into signals recognizable by the processor 412. The output interface 416 receives a control signal from the processor 412, and converts the control signal into an output suitable for the prompting device 601. In the course of operation, after receiving signals from the sensors 301, 302, the processor 412 performs the required functions according to the input from the sensors 301, 302, to judge whether the solder paste cartridge 101 still contains solder paste, and judge whether to send a control signal to the prompting device 601 to control the prompting device 601 to issue a suitable prompt. Similarly, in the course of operation, upon receiving a control signal from the processor 412, the output interface 416 outputs the control signal to the prompting device 601 to control the prompting device to issue a suitable prompt.

Although the present disclosure has been described in conjunction with the examples of embodiments outlined above, various alternatives, modifications, changes, improvements and/or substantial equivalents, whether already known or foreseeable now or presently, may be obvious to those skilled in the art. In addition, the technical effects and/or technical problems described in this specification are exemplary rather than limiting; therefore, the disclosures in this specification may be used to solve other technical problems and have other technical effects and/or may solve other technical problems. Thus, the examples of embodiments of the present disclosure as set forth above are intended to be illustrative and not restrictive. Various changes may be made without departing from the spirit or scope of the present disclosure. Accordingly, the present disclosure is intended to include all known or earlier developed alternatives, modifications, changes, improvements and/or substantial equivalents.

The invention claimed is:

1. A solder paste dispensing feedback system for a circuit board printer, characterized by comprising:
   a solder paste container (101), the solder paste container (101) being used to contain solder paste, and the solder paste container having an outlet (102);
   a solder paste extruding device (201), the solder paste extruding device (201) being used to extrude the solder paste from the outlet (102) of the solder paste container (101);
   a first sensor (301), the first sensor (301) being configured to detect solder paste in the solder paste container (101) and generate a first signal, the first signal being used to indicate whether the solder paste container (101) still contains solder paste;
   a second sensor (302), the second sensor (302) being configured to detect an operating state of the solder paste container (101) and generate a second signal, the second signal being used to indicate whether solder paste is extruded from the outlet (102) of the solder paste container (101);
   a control device (401), the control device (401) being configured to receive the first signal and the second signal, and control the operation of the circuit board printer according to the indications of the first signal and the second signal, characterized in that:
   the solder paste dispensing feedback system comprises a mounting support (501) for fixing the solder paste container (101);
   the solder paste container (101) has a tail portion (103) positioned toward the outlet (102);
   the first sensor (301) is arranged on the mounting support (501) proximate to the tail portion (103) of the solder paste container (101); and
   the first sensor (301) is an eddy current proximity switch.

2. A solder paste dispensing feedback system for a circuit board printer, characterized by comprising:
   a solder paste container (101), the solder paste container (101) being used to contain solder paste, and the solder paste container having an outlet (102);
   a solder paste extruding device (201), the solder paste extruding device (201) being used to extrude the solder paste from the outlet (102) of the solder paste container (101);
   a first sensor (301), the first sensor (301) being configured to detect solder paste in the solder paste container (101) and generate a first signal, the first signal being used to indicate whether the solder paste container (101) still contains solder paste;
   a second sensor (302), the second sensor (302) being configured to detect an operating state of the solder paste container (101) and generate a second signal, the second signal being used to indicate whether solder paste is extruded from the outlet (102) of the solder paste container (101);
   a control device (401), the control device (401) being configured to receive the first signal and the second signal, and control the operation of the circuit board printer according to the indications of the first signal and the second signal, characterized in that:
   the control device (401) is configured such that:
   when the first signal of the first sensor (301) indicates that there is solder paste in the solder paste container (101), and the second signal of the second sensor (302) indicates that solder paste is extruded from the outlet (102) of the solder paste container (101), the control device (401) controls the circuit board printer to continue operating;
   when the first signal of the first sensor (301) indicates that there is solder paste in the solder paste container (101), and the second signal of the second sensor (302) indicates that no solder paste is extruded from the outlet (102) of the solder paste container (101) within a predetermined period of time, the control device (401) controls the circuit board printer to issue a confirmation prompt, so as to prompt an operator to confirm by observation whether the solder paste in the solder paste container (101) has been used up;
   when the first signal of the first sensor (301) indicates that there is no solder paste in the solder paste container (101), and the second signal of the second sensor (302) indicates that solder paste is extruded from the outlet (102) of the solder paste container (101), the control device (401) controls the circuit board printer to continue operating; or
   when the first signal of the first sensor (301) indicates that there is no solder paste in the solder paste container (101), and the second signal of the second sensor (302) indicates that no solder paste is extruded from the outlet (102) of the solder paste container (101) within a predetermined period of time, the control device (401) controls the circuit board printer to issue a replacement prompt, to prompt the operator to replace the solder paste container (101).

3. A solder paste dispensing feedback system for a circuit board printer, characterized by comprising:
   a solder paste container (101), the solder paste container (101) being used to contain solder paste, and the solder paste container having an outlet (102);
   a solder paste extruding device (201), the solder paste extruding device (201) being used to extrude the solder paste from the outlet (102) of the solder paste container (101);
   a first sensor (301), the first sensor (301) being configured to detect solder paste in the solder paste container (101) and generate a first signal, the first signal being used to indicate whether the solder paste container (101) still contains solder paste;
   a second sensor (302), the second sensor (302) being configured to detect an operating state of the solder paste container (101) and generate a second signal, the second signal being used to indicate whether solder paste is extruded from the outlet (102) of the solder paste container (101);
   a control device (401), the control device (401) being configured to receive the first signal and the second signal, and control the operation of the circuit board printer according to the indications of the first signal and the second signal, characterized in that:
   the solder paste has an extrusion path from the outlet (102) of the solder paste container (101), and the second sensor (302) is located downstream of the outlet (102) of the solder paste container (101) in the direction of the extrusion path of the solder paste, and to the outlet (102) of the solder paste container (101);
   the second sensor (302) is a photoelectric sensor; and
   the photoelectric sensor defines an opening region (303a, 303b), and the extrusion path of the solder paste passes through the opening region (303a, 303b).

4. The solder paste dispensing feedback system as claimed in claim 3, characterized in that:

the photoelectric sensor is a slot-type photoelectric sensor (302*a*) or a frame-type photoelectric sensor (302*b*).

5. The solder paste dispensing feedback system as claimed in claim 2, characterized in that:
   the solder paste extruding device (201) is a gas input device (201);
   the solder paste container (101) has a gas inlet (104) and a piston (105), the gas inlet (104) being arranged at one end of the solder paste container (101) opposite the outlet (102), and the piston (105) being contained in the solder paste container (101);
   wherein the solder paste container (101) receives gas through the gas inlet (104) from the gas input device (201), and the piston (105) is configured to be pushed in the direction of the outlet (102) of the solder paste container (101) by the gas inputted through the gas inlet (104), to extrude the solder paste from the solder paste container (101).

6. A circuit board printer, characterized by comprising the solder paste dispensing feedback system as claimed in claim 2.

\* \* \* \* \*